US012802765B2

(12) United States Patent
Zhao et al.

(10) Patent No.: US 12,802,765 B2
(45) Date of Patent: Nov. 17, 2026

(54) STORAGE DEVICE AND OPERATING METHOD THEREOF

(71) Applicant: SK hynix Inc., Gyeonggi-do (KR)

(72) Inventors: Dengtao Zhao, San Jose, CA (US); Changhyun Lee, San Jose, CA (US); Kyeongran Yoo, San Jose, CA (US); Sung-Taeg Kang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 122 days.

(21) Appl. No.: 18/916,586

(22) Filed: Oct. 15, 2024

(65) Prior Publication Data

US 2026/0105977 A1 Apr. 16, 2026

(51) Int. Cl.

*G11C 16/34* (2006.01)
*G11C 16/10* (2006.01)
*G11C 16/24* (2006.01)

(52) U.S. Cl.

CPC ........ *G11C 16/3459* (2013.01); *G11C 16/102* (2013.01); *G11C 16/24* (2013.01); *G11C 16/3404* (2013.01)

(58) Field of Classification Search

CPC ... G11C 16/3459; G11C 16/102; G11C 16/24; G11C 16/3404
USPC ........................................ 365/185.22, 185.24
See application file for complete search history.

(56) References Cited

U.S. PATENT DOCUMENTS 7,751,246 B2 * 7/2010 Moschiano ........ G11C 16/3454 365/185.17
2009/0219761 A1 9/2009 Moschiano et al.
2009/0290426 A1 11/2009 Moschiano et al.
2010/0246270 A1 9/2010 Moschiano et al.
2011/0255344 A1 10/2011 Moschiano et al.
2012/0075932 A1 3/2012 Moschiano et al.
2017/0040062 A1 * 2/2017 Shiino .................... G11C 16/14
2020/0118635 A1 * 4/2020 De Santis ............ G11C 29/021
2020/0411098 A1 * 12/2020 De Santis .............. G11C 16/08
2022/0190622 A1 * 6/2022 Kobayashi ................ H02J 7/50
2022/0336028 A1 * 10/2022 Moschiano .......... G11C 7/1048

* cited by examiner

*Primary Examiner* — Michael T Tran
(74) *Attorney, Agent, or Firm* — IP & T GROUP LLP

(57) ABSTRACT

An operating method of a storage device includes performing an (N-1)$^{th}$ step program operation of N number of step program operations on a group of non-volatile memory cells, N being a natural number of 2 or greater; performing, after completion of the (N-1)$^{th}$ step program operation, a detection operation (e.g., a pre-read before the N$^{th}$ program operation) of detecting a quick charge loss (QCL) cell belonging to the group; and performing, upon completion of the detection operation, an N$^{th}$ step program operation of the N number of step program operations, the N$^{th}$ step program operation including a compensation operation of compensating a threshold voltage of the QCL cell. The N$^{th}$ step program operation is performed according to a double verify program (DPGM) scheme.

14 Claims, 10 Drawing Sheets

$$VGL = \overline{QCL} \otimes PVpre$$

| | | QCL or Non-QCL cell | |
|---|---|---|---|
| | | QCL=0 (QCL cell) | QCL=1 (Non-QCL cell) |
| PGM cell or DPGM cell | PVpre=0 (Vth < Vpre) (PGM cell) | 0 | 0 |
| | PVpre=1 (Vth ≥ Vpre) (DPGM cell) | 1 | 0 |

STORAGE DEVICE AND OPERATING METHOD THEREOF

BACKGROUND

1. Field

Embodiments of the present disclosure relate to a storage device and an operating method thereof.

2. Description of the Related Art

A storage system stores data in response to a request from a host system such as a computer, smartphone, or smart pad. An example of a storage system is a system configured to store data in a semiconductor memory, especially in a nonvolatile memory, such as a solid-state drive (SSD) or a memory card.

A storage system includes a storage device configured to store data and a controller configured to control the storage device. Generally, a storage device can be volatile or non-volatile. Examples of a non-volatile storage device are Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), and Ferroelectric RAM (FRAM).

SUMMARY

In an embodiment of the present disclosure, an operating method of a storage device may include performing an $(N-1)^{th}$ step program operation of N number of step program operations on a group of non-volatile memory cells, N being a natural number of 2 or greater; performing, after completion of the $(N-1)^{th}$ step program operation, a detection operation of detecting a quick charge loss (QCL) cell belonging to the group; and performing, upon completion of the detection operation, an $N^{th}$ step program operation of the N number of step program operations, the $N^{th}$ step program operation including a compensation operation of compensating a threshold voltage of the QCL cell. The $N^{th}$ step program operation may be performed according to a double verify program (DPGM) scheme.

In another embodiment of the present disclosure, a storage device may include a group of non-volatile memory cells and a control circuit. The control circuit may be configured to perform an $(N-1)^{th}$ step program operation of N number of step program operations on the group, N being a natural number of 2 or greater; perform, after completion of the $(N-1)^{th}$ step program operation, a detection operation of detecting a quick charge loss (QCL) cell belonging to the group; and perform, upon completion of the detection operation, an $N^{th}$ step program operation of the N number of step program operations, the $N^{th}$ step program operation including a compensation operation of compensating a threshold voltage of the QCL cell. The control circuit may perform the $N^{th}$ step program operation according to a double verify program (DPGM) scheme.

Additional embodiments of the present disclosure will become apparent from the following description.

DETAILED DESCRIPTION

Figure 1:
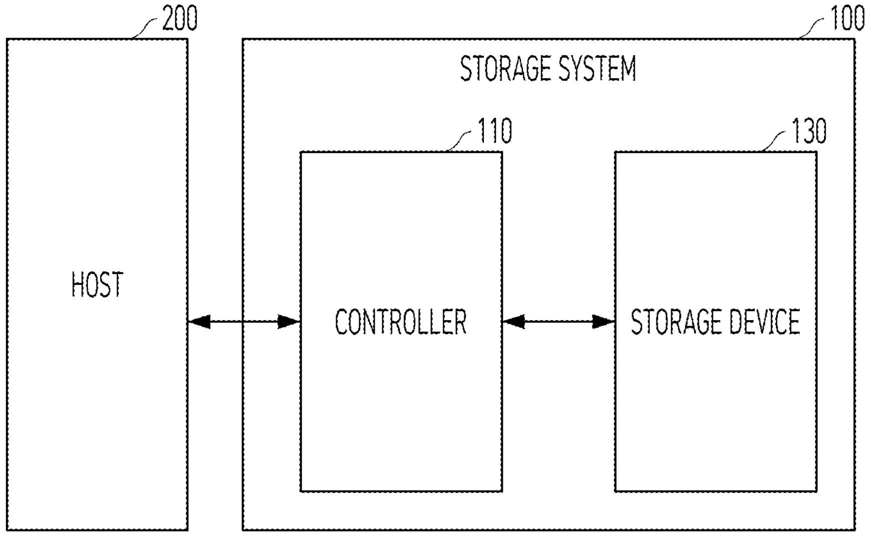
FIG. 1 is a block diagram illustrating a storage system according to an embodiment of the present disclosure.

Various embodiments of the present disclosure are described below in more detail with reference to the accompanying drawings. The present invention may, however, be embodied in different forms and thus should not be construed as limited to the embodiments set forth herein. Rather, these embodiments are provided so that this disclosure conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout this disclosure, like reference numerals refer to like parts in the figures and embodiments of the present disclosure.

Embodiments of the present disclosure can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these embodiments, or any other form that the present invention may take, may be referred to as techniques. In general, the order of the operations of disclosed processes may be altered within the scope of the present invention. Unless stated otherwise, a component such as a processor or a memory described as being suitable for performing a task may be implemented as a general device or circuit component that is configured or otherwise programmed to perform the task at a given time or as a specific device or circuit component that is manufactured to perform the task. As used herein, the term 'processor' or the like refers to one or more devices, circuits, and/or processing cores suitable for processing data, such as computer program instructions.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described herein, the code or instructions for implementing the operations of the method embodiments may transform the computer, processor, controller, or other signal processing device into a special-purpose processor for performing methods herein.

FIG. 1 is a block diagram illustrating a storage system 100 according to an embodiment of the present disclosure.

Referring to FIG. 1, the storage system 100 may include a storage device 130 and a controller 110.

The storage system 100 may access data stored therein in response to a request from a host system (HOST) 200. Examples of the host system 200 include a cellular phone, a smartphone, an MP3 player, a laptop computer, a desktop computer, a game player, a TV, a tablet PC, and an in-vehicle infotainment system.

The storage system 100 may be implemented as any of various types of storage systems. For example, the storage system 100 may be implemented as a solid state drive (SSD), a multimedia card in the form of a multimedia card (MMC), (e.g., an eMMC, an RS-MMC, or a micro-MMC), a secure digital card in the form of an SD (e.g., a mini-SD or a micro-SD), a universal serial bus (USB) storage device, a universal flash storage (UFS) device, a personal computer memory card international association (PCMCIA) card type storage device, a peripheral component interconnection (PCI) card type storage device, a PCI express (PCI-e) card type storage device, a compact flash (CF) card, a smart media card, or a memory stick.

The storage system 100 may be manufactured through any of various types of packages. For example, the storage system 100 may be manufactured through a package on package (POP), a system in package (SIP), a system on chip (SOC), a multi-chip package (MCP), a chip on board (COB), a wafer-level fabricated package (WFP), or a wafer-level stack package (WSP).

The storage device 130 may access data therein. The storage device 130 may operate in response to a command from the controller 110. The storage device 130 may include a memory cell array 210 including a plurality of memory cells configured to store data therein. The memory cell array may include a plurality of memory blocks. Each of the memory blocks may include pages, each of which includes memory cells. According to an embodiment, data may be stored in and readout from the storage device 130 in units of page-sizes. Data may be erased or removed from the storage device 130 in units of block-sizes.

According to an embodiment, the storage device 130 may be any of Double Data Rate Synchronous Dynamic Random-Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), NAND flash memory, Vertical NAND flash memory, NOR flash memory, resistive random-access memory (RRAM), phase-change random-access memory (PRAM), magneto-resistive random-access memory (MRAM), ferroelectric random-access memory (FRAM), spin-transfer torque random-access memory (STT-RAM) and so forth. By way of example, the storage device 130 can be a NAND flash memory in the context of the following description.

The storage device 130 may have a two-dimensional or three-dimensional array structure. The embodiments of the present disclosure may be applied not only to a flash memory device, in which a charge storage layer includes a conductive floating gate (FG), but also to a charge trap flash (CTF) memory device, in which a charge storage layer includes an insulating layer.

The storage device 130 may receive a command and an address from the controller 110. The storage device 130 may access, in response to the command, an area selected by the address within the memory cell array. For example, the storage device 130 may perform, in response to the command, various operations such as a write operation or a program operation, a read operation and an erase operation. For example, during the program operation, the storage device 130 may program data into the selected area. During the read operation, the storage device 130 may read data from the selected area. During the erase operation, the storage device 130 may erase or remove data from the selected area.

The controller 110 may control an operation of the memory device 50.

When a power voltage is applied to the storage system 100, the controller 110 may execute firmware such as a Flash Translation Layer (FTL) for controlling communication between the host system 200 and the storage device 130.

According to an embodiment, the controller 110 may receive data and a logical address from the host system 200 and include firmware (not shown) that translates the logical address into a physical address. A logical address may be identified by the host system 200 and may indicate a logical location within the storage device 130. A physical address may indicate an actual location within the storage device 130. The controller 110 may manage, in an operational memory, a logical-to-physical map table representing a mapping relationship between the logical address and the physical address.

In response to a request from the host system 200, the controller 110 may control the storage device 130 to perform an operation. For example, in response to a program request from the host system 200, the controller 110 may provide a program command, a physical address and data to the storage device 130. In response to a read request provided together with a logical address from the host system 200, the controller 110 may provide the storage device 130 with the read command and a physical address corresponding to the logical address. In response to an erase request provided together with a logical address from the host system 200, the controller 110 may provide the storage device 130 with an erase command and a physical address corresponding to the logical address.

Without a request from the host system 200, the controller 110 may control the storage device 130 to perform a background operation such as a program operation for wear leveling or for garbage collection.

According to an embodiment, the storage system 100 may further include an operational memory (not shown). The controller 110 may control data exchange between the host system 200 and the operational memory. The controller 110 may temporarily store, in the operational memory, system data for controlling the storage device 130. For example, the controller 110 may temporarily store, in the operational memory, data from the host system 200 and transfer the temporarily stored data to the storage device 130.

As a buffer memory, the operational memory may store codes or commands executed by the controller 110. As a cache memory, the operational memory may store data processed by the controller 110.

According to an embodiment, the operational memory may be any of DRAM such as DDR SDRAM, LPDDR4 SDRAM, GDDR SDRAM, LPDDR or RDRAM, SRAM and so forth.

The host system 200 may communicate with the storage system 100 through at least one of various communication interfaces or standards such as a Universal Serial Bus (USB), Serial AT Attachment (SATA), a Serial Attached SCSI (SAS), a High Speed Interchip (HSIC), a Small Computer System Interface (SCSI), a Peripheral Component Interconnection (PCI), PCI express (PCIe), NonVolatile Memory express (NVMe), Universal Flash Storage (UFS), Secure Digital (SD), a Multi-Media Card (MMC), an embedded MMC (eMMC), a Dual In-line Memory Module (DIMM), a Registered DIMM (RDIMM), a Load Reduced DIMM (LRDIMM) and so forth.

Figure 2:
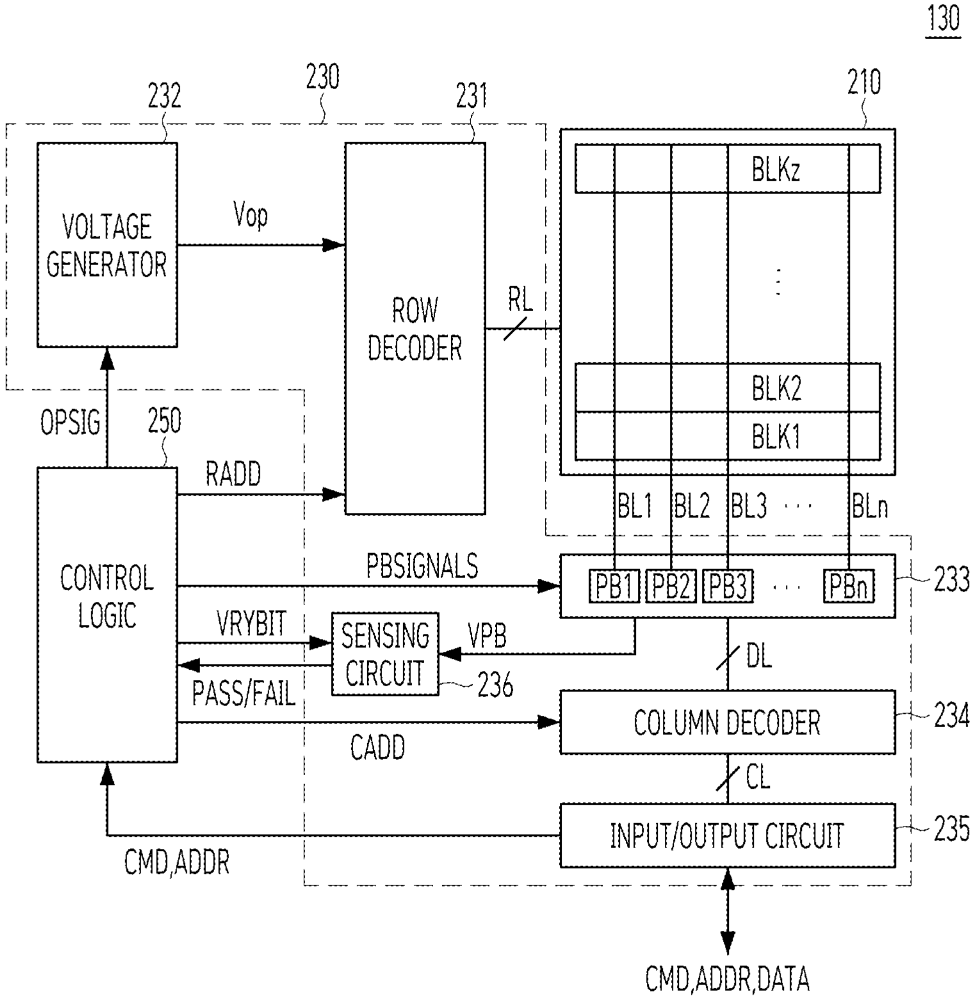
FIG. 2 is a diagram illustrating a structure of a storage device according to an embodiment of the present disclosure.

FIG. 2 is a diagram illustrating a structure of the storage device 130 according to an embodiment of the present disclosure.

Referring to FIG. 2, the storage device 130 may include the memory cell array 210, an operating circuit 230 and a control logic 250.

The memory cell array 210 may include a plurality of memory blocks BLK1 to BLKz coupled to a row decoder 231 through row lines RL, each configured by at least one source select line, a plurality of word lines, and at least one drain select line. The plurality of memory blocks BLK1 to BLKz may be coupled to a page buffer group 233 through bit lines BL1 to BLn. Each of the plurality of memory blocks BLK1 to BLKz may include a plurality of pages. A page may be defined as a group of memory cells coupled to a single word line. The plurality of memory cells may be nonvolatile.

According to an embodiment, the memory cell array 210 may include any of a single-level cell (SLC), a multi-level cell (MLC), a triple-level cell (TLC), a quadruple-level cell (QLC), and a further-higher-level cell, which will not limit the scope of the present disclosure.

The operating circuit 230 may be operable under the control of the control logic 250. The operating circuit 230 may perform an operation on a selected area within the memory cell array 210. The operating circuit 230 may drive the memory cell array 210. For example, the operating circuit 230 may apply various operating voltages to the row lines RL and the bit lines BL1 to BLn or discharge the applied voltages.

The operating circuit 230 may include the row decoder 231, a voltage generator 232, the page buffer group 233, a column decoder 234, an input/output circuit 235 and a sensing circuit 236.

The row decoder 231 may be coupled to the memory cell array 210 through the row lines RL. Within the row lines RL, the word lines may include normal word lines and dummy word lines. The row lines RL may further include a pipe select line.

The row decoder 231 may decode a row address RADD from the control logic 250. The row decoder 231 may select, according to the decoded address, at least one from the memory blocks BLK1 to BLKz. The row decoder 231 may select, according to the decoded address, at least one from the word lines coupled to the selected memory block to apply a voltage Vop from the voltage generator 232 to the selected word line.

For example, during a program pulse application process, the row decoder 231 may apply a program voltage to the selected word line and a program pass voltage to unselected word lines. During a verification process, the row decoder 231 may apply a verify voltage to the selected word line and a verify pass voltage to the unselected word lines. During a read operation, the row decoder 231 may apply a read voltage to the selected word line and a read pass voltage to the unselected word lines. During an erase operation, the row decoder 231 may select, according to the decoded address, one of the memory blocks BLK1 to BLKz and may apply a ground voltage to word lines coupled to the selected memory block.

The voltage generator 232 may operate under the control of the control logic 250. The voltage generator 232 may generate various operating voltages Vop through an external power voltage supplied to the storage device 130 or an internal power voltage regulated from the external power voltage. The voltage generator 232 may generate, in response to an operation signal OPSIG, the operating voltages Vop for program, read and erase operations. For example, the voltage generator 232 may generate a program voltage, a verify voltage, a pass voltage, a read voltage, and an erase voltage.

The page buffer group 233 may include first to n-th page buffers PB1 to PBn coupled to the memory cell array 210 through the respective first to n-th bit lines BL1 to BLn. The first to n-th page buffers PB1 to PBn may operate under the control of the control logic 250. The first to n-th page buffers PB1 to PBn may operate in response to page buffer control signals PBSIGNALS. The first to n-th page buffers PB1 to PBn may temporarily store therein data provided through the first to n-th bit lines BL1 to BLn or may sense voltages or currents of the bit lines BL1 to BLn during a read or verification process.

When a program voltage is applied to a selected word line during a program pulse application process, the first to n-th page buffers PB1 to PBn may transfer data DATA from the column decoder 234 and the input/output circuit 235 to selected memory cells through the first to n-th bit lines BL1 to BLn. Memory cells of the selected page may be programmed according to the transferred data DATA. During a verification process, the first to n-th page buffers PB1 to PBn may sense a voltage or a current from the first to n-th bit lines BL1 to BLn to read page data from the selected memory cells.

Under the control of the column decoder 234 during a read operation, the first to n-th page buffers PB1 to PBn may read the data DATA from the memory cells of the selected page through the first to n-th bit lines BL1 to BLn and may output the read data DATA to the input/output circuit 235.

During an erase operation, the first to n-th page buffers PB1 to PBn may float the first to n-th bit lines BL1 to BLn or may apply an erase voltage to the first to n-th bit lines BL1 to BLn.

The column decoder 234 may transfer data between the input/output circuit 235 and the page buffer group 233 according to a column address CADD. For example, the column decoder 234 may exchange data with the first to n-th page buffers PB1 to PBn through data lines DL and with the input/output circuit 235 through column lines CL.

The input/output circuit 235 may transfer a command CMD and an address ADDR from the controller 110 to the control logic 250 and may communicate the data DATA with the column decoder 234.

During a read operation or a verification process, the sensing circuit 236 may generate a reference current according to an allowable bit VRYBIT. The sensing circuit 236 may compare a sensing voltage VPB from the page buffer group 233 with a reference voltage generated by the reference current. As the result of the comparison, the sensing circuit 236 may output a pass signal PASS or a fail signal FAIL.

In response to the command CMD and the address ADDR, the control logic 250 may control the operating circuit 230 through the operation signal OPSIG, the row address RADD, the page buffer control signals PBSIGNALS and the allowable bit VRYBIT. The control logic 250 may control a read operation on a selected memory block in response to a sub-block read command and an address. The control logic 250 may control an erase operation on a selected sub-block included in the selected memory block in response to a sub-block erase command and the address. The control logic 250 may determine whether a verification process passes or fails according to the pass or fail signal PASS or FAIL.

Figure 3:
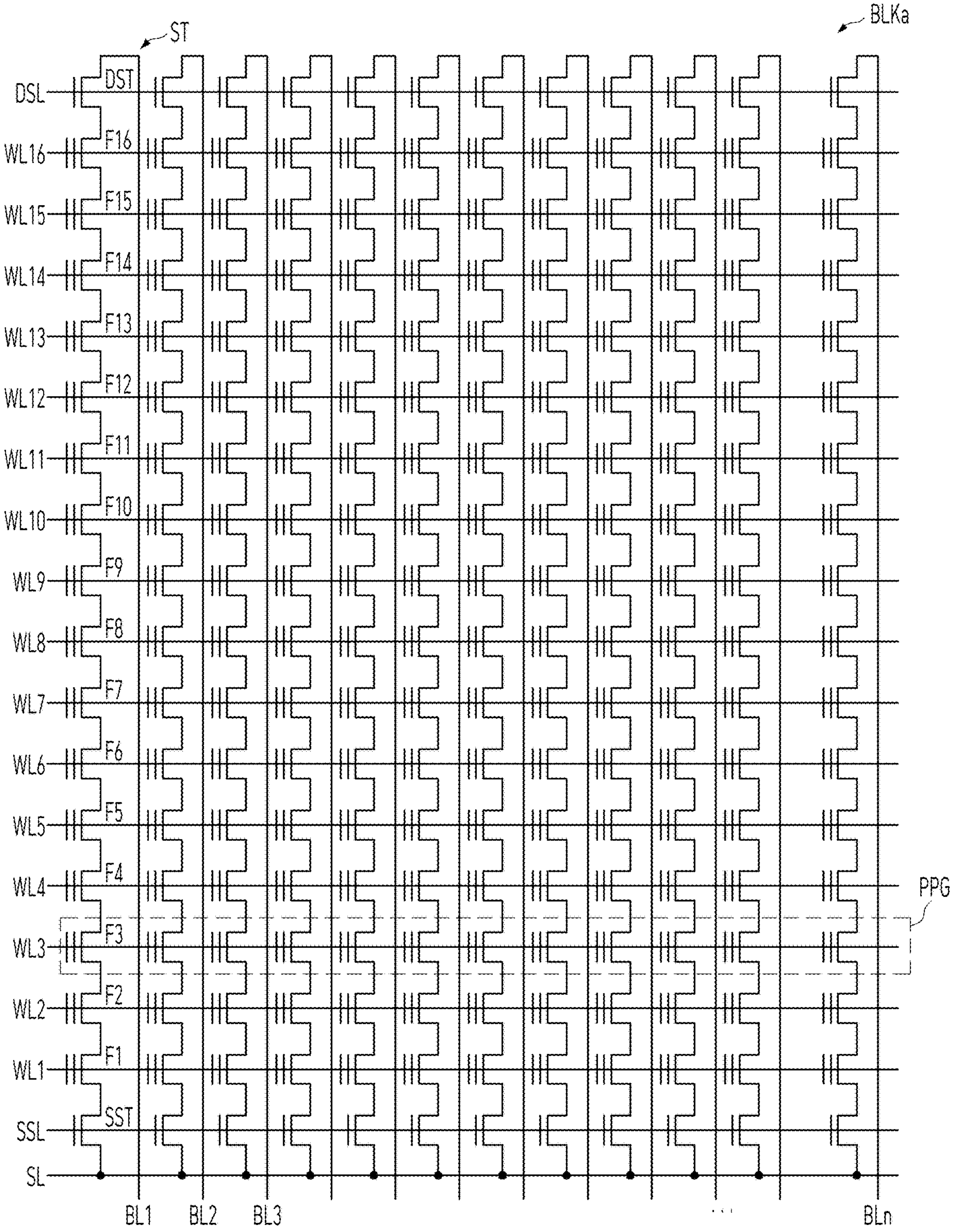
FIG. 3 is a diagram illustrating a memory cell array according to an embodiment of the present disclosure.

FIG. 3 is a diagram illustrating the memory cell array 210 according to an embodiment of the present disclosure. FIG. 3 is a circuit diagram showing a representative memory block BLKa among the plurality of memory blocks BLK1 to BLKz in the memory cell array 210.

A first select line, word lines, and a second select line arranged in parallel with each other may be coupled to the memory block BLKa. The word lines may be arranged in parallel with each other between the first and second select lines. The first select line may be a source select line SSL and the second select line may be a drain select line DSL.

The memory block BLKa may include a plurality of strings coupled between the bit lines BL1 to BLn and a source line SL. The bit lines BL1 to BLn may be coupled to the respective strings and the strings may be commonly coupled to the source line SL. The strings may have the same configuration and a string ST coupled to the first bit line BL1 is described in detail as an example.

The string ST may include a source select transistor SST, a plurality of memory cells F1 to F16, and a drain select transistor DST coupled in series between the source line SL and the first bit line BL1. Although not illustrated, each string ST may include plural source select transistors SST, plural drain select transistors DST and more than the 16 memory cells F1 to F16.

A source of the source select transistor SST may be coupled to the source line SL and a drain of the drain select transistor DST may be coupled to the first bit line BL1. The memory cells F1 to F16 may be coupled in series between the source select transistor SST and the drain select transistor DST. Gates of the source select transistors SST included in different strings may be coupled to the source select line SSL. Gates of the drain select transistors DST included in the different strings may be coupled to the drain select line DSL. Gates of the memory cells F1 to F16 included in the different strings may be coupled to respective word lines WL1 to WL16. A group of memory cells coupled to the same word line among memory cells included in different strings may be referred to as a physical page PPG. The memory block BLKa may include as many physical pages PPG as the number of word lines WL1 to WL16.

The single physical page PPG including SLCs may store data of a single logical page LPG. The data of the single logical page LPG may include as many bits of data as the number of memory cells included in the single physical page PPG. The single physical page PPG including MLCs may store data of two or more logical pages LPG.

According to an embodiment, a memory block may have a three-dimensional structure. Each memory block may include a plurality of memory cells stacked over a substrate. The plurality of memory cells may be arranged in a +X direction, a +Y direction, and a +Z direction.

In an embodiment, the combination of the operating circuit 230 and the control logic 250 may be referred to as a control circuit. The control circuit may perform an operation on the memory cell array 210 as described herein. The control circuit may control the memory cell array 210 to perform an operation described herein.

Figure 4:
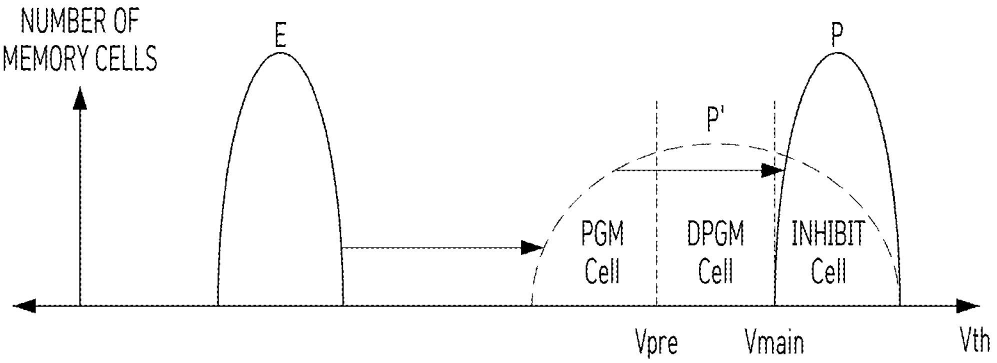
FIG. 4 is a diagram illustrating a program operation according to a double verify program scheme, according to an embodiment of the present disclosure.

FIG. 4 is a diagram illustrating a program operation according to a double verify program (DPGM) scheme, which is also known as a selective slow programming convergence (SSPC) scheme, according to an embodiment of the present disclosure.

By way of example, FIG. 4 illustrates a process of programming memory cells from an erase state E to a program state P according to the DPGM scheme. In FIG. 4, a horizontal axis refers to a threshold voltage Vth of memory cells and a vertical axis refers to the number of memory cells. In FIG. 4, by way of example, the storage device 130 performs a program operation on a SLC.

Referring to FIG. 4, the memory cells in the erase state E may be programmed to the program state P as a target program state through the double verify program operation. The memory cells in the erase state E may be programmed to the program state P via a state P'.

According to an embodiment, a double verify program operation may include a program pulse application process and a verification process. The verification process may be performed with two verify voltage levels. The two verify voltage levels may be a pre-verify voltage level Vpre and a main verify voltage level Vmain. The main verify voltage level Vmain may correspond to the target program state P. The pre-verify voltage level Vpre may be lower than the main verify voltage level Vmain and may be for verifying a degree to which the program operation is performed.

The verification process may be performed twice, a first time according to the pre-verify voltage level Vpre and a second time according to the main verify voltage level Vmain.

After a program pulse is applied to the memory cells in the erase state E, the verification process may be performed through the pre-verify voltage level Vpre and the main verify voltage level Vmain. As a result of the verification process, the memory cells may be classified into three types of memory cells: first program permission memory cells (hereinafter, referred to as PGM cells), second program permission memory cells (hereinafter, referred to as DPGM cells) and program inhibition memory cells (hereinafter, referred to as INHIBIT cells). The PGM cells may have a threshold voltage lower than the pre-verify voltage level Vpre. The DPGM cells may have a threshold voltage between the pre-verify voltage level Vpre and the main verify voltage level Vmain. The INHIBIT cells may have a threshold voltage higher than the main verify voltage level Vmain.

The INHIBIT cells are already in the target program state P, and a program pulse need not be applied to gates of the INHIBIT cells any longer.

The PGM cells and the DPGM cells have not reached the target program state P yet, and the program pulse may be applied to the PGM cells and DPGM cells again.

The PGM cells may be slow cells on which a program operation is performed at a relatively low speed, whereas the DPGM cells may be fast cells on which the program operation is performed at a relatively high speed. During a program operation, a voltage level of bit lines coupled to the DPGM cells may be set differently from a voltage level of bit lines coupled to the PGM cells. In an embodiment, the voltage level of bit lines coupled to the DPGM cells may be set higher than the voltage level of bit lines coupled to the PGM cells.

For example, the voltage level of the bit lines coupled to the PGM cells may be set to a ground voltage GND level and the voltage level of the bit lines coupled to the DPGM cells may be set differently from the ground voltage GND level. In an embodiment, the voltage level of the bit lines coupled to the DPGM cells may be higher than the ground voltage GND level. The speed of the program operation on the DPGM cells is relatively high when compared with the speed of the program operation on the PGM cells. Therefore, in consideration of the speed of the program operation, the voltage level of the bit lines coupled to the DPGM cells may be set to the different level from the ground voltage GND level or the voltage level of the bit lines coupled to the PGM cells.

As the voltage level of the bit lines coupled to the PGM cells is set differently from the voltage level of the bit lines coupled to the DPGM cells, a threshold voltage distribution of the memory cells may become narrower.

Figure 5:
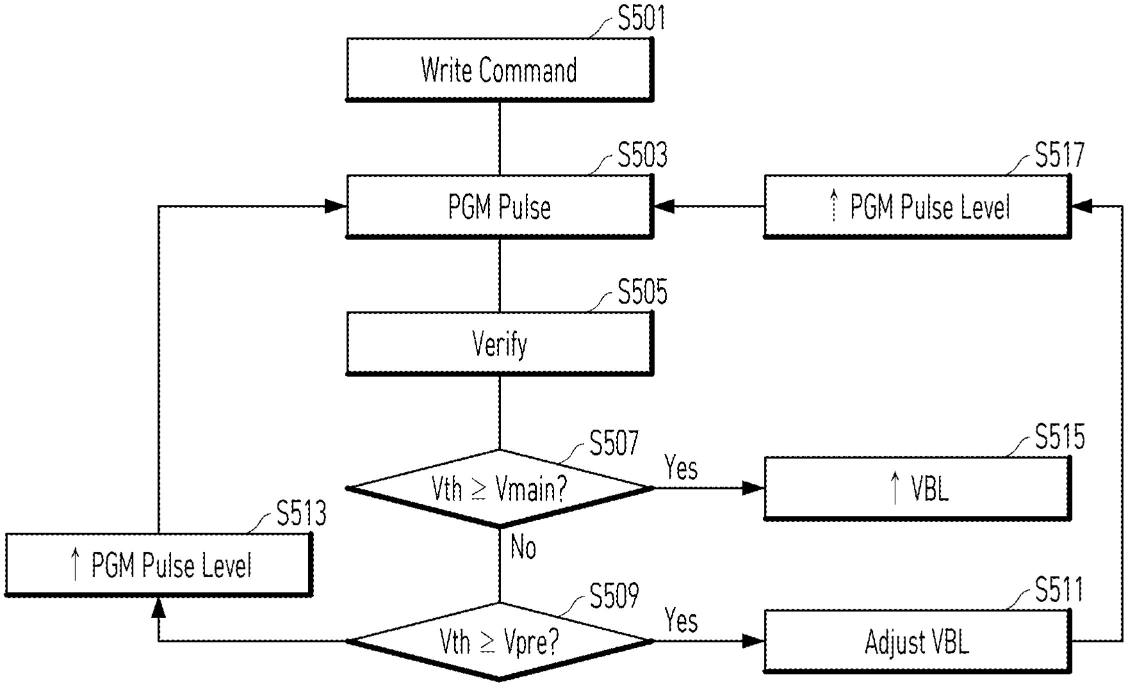
FIG. 5 is a flowchart illustrating a program operation according to the double verify program scheme, according to an embodiment of the present disclosure.

FIG. 5 is a flowchart illustrating a program operation according to the DPGM scheme, according to an embodiment of the present disclosure.

Referring to FIG. 5, the controller 110 may provide the storage device 130 with a write command to program data into one or more memory cells in an operation S501. In an operation S503, the storage device 130 may apply a programming pulse to a selected word line. In an operation S505, the storage device 130 may perform a verification process to determine whether a cell coupled to the selected word line has been properly programmed.

When the cell is determined as properly programmed in an operation S507 as a result of the verification process of the operation S505, that is, when the cell is determined as the INHIBIT cell having the threshold voltage Vth higher than the main verify voltage level Vmain, the storage device 130 may raise, in an operation S515, a voltage VBL to a program-inhibit level. The voltage VBL may be applied to a bit line coupled to the INHIBIT cell.

When the threshold voltage Vth of the cell is determined not yet to reach the main verify voltage level Vmain in the operation S507 but determined to reach the pre-verify voltage level Vpre in an operation S509 as the result of the verification process of the operation S505, that is, when the cell is determined as the DPGM cell having the threshold voltage Vth between the pre-verify voltage level Vpre and the main verify voltage level Vmain, the storage device 130 may adjust the voltage VBL in an operation S511. As a result of the operation S511, the storage device 130 may set the voltage level of the bit lines coupled to the DPGM cell to the different level from the ground voltage GND level or the voltage level of the bit lines coupled to the PGM cell. In an embodiment, the voltage level of the bit line coupled to the DPGM cell may be higher than the ground voltage GND level or the voltage level of the bit lines coupled to the PGM cell.

After the operation S511, the storage device 130 may repeat the process from the operation S503 by increasing stepwise the level of the programming pulse in an operation S517.

When the threshold voltage Vth of the cell is determined not yet to reach both the main verify voltage level Vmain and the pre-verify voltage level Vpre in the operation S507 and operation S509 as the result of the verification process of the operation S505, that is, when the cell is determined as the PGM cell having the threshold voltage Vth lower than the pre-verify voltage level Vpre, the storage device 130 may repeat the process from the operation S503 by increasing stepwise the level of the programming pulse in an operation S513.

Figure 6:
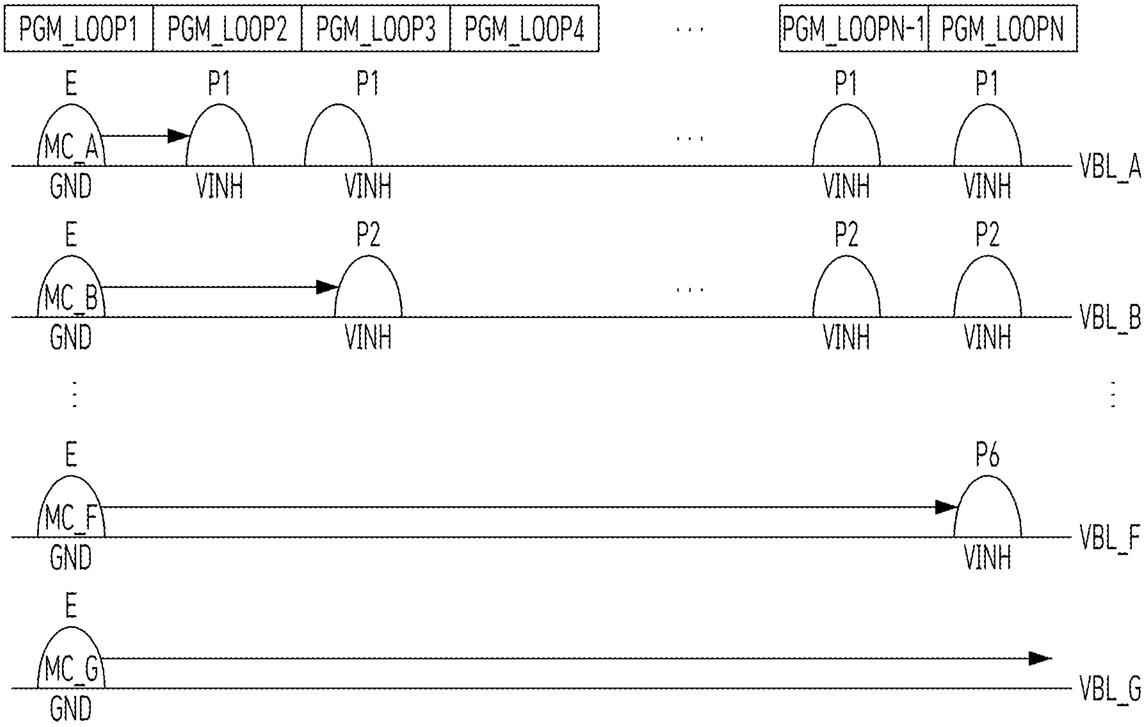
FIG. 6 is a diagram illustrating a program operation according to a program loop scheme, according to an embodiment of the present disclosure.

FIG. 6 is a diagram illustrating a program operation according to a program loop scheme, according to an embodiment of the present disclosure.

Referring to FIG. 6, a plurality of program loops PGM_LOOP1 to PGM_LOOPN, where N is any suitable natural number of 2 or more, are performed on selected memory cells during a program operation. A single program operation on a page may comprise the 'N' number of program loops PGM_LOOP1 to PGM_LOOPN at maximum. Each of the plurality of program loops PGM_LOOP1 to PGM_LOOPN may include the program pulse application process and the verification process. The verification process may be performed according to the pre-verify voltage level Vpre and the main verify voltage level Vmain.

In FIG. 6, by way of example, the memory cells are TLCs and programmed from the erase state E to one of first to seventh program states P1 to P7.

As an example, among the selected memory cells to which the program operation is performed, memory cells MC_A may be programmed to the first program state P1, memory cells MC_B to the second program state P2, memory cells MC_C to the third program state P3, memory cells MC_D to the fourth program state P4, memory cells MC_E to the fifth program state P5, memory cells MC_F to the sixth program state P6 and memory cells MC_G to the seventh program state P7. When the program operation is permitted, a voltage of a bit line coupled to each of memory cells MC_A to MC_F may be set to the ground voltage GND or a VM voltage, which is 1V as an example.

All memory cells MC_A are programmed to the first program state P1 in the first program loop PGM_LOOP1. Accordingly, a program operation on the memory cells MC_A may be inhibited from the second program loop PGM_LOOP2. Accordingly, from the second program loop PGM_LOOP2, a voltage level of a bit line VBL_A coupled to each of the memory cells MC_A may be set to the program inhibition voltage level VINH.

All memory cells MC_B are programmed to the second program state P2 in the second program loop PGM_LOOP2. Accordingly, a program operation on the memory cells MC_B may be inhibited from the third program loop PGM_LOOP3. Accordingly, from the third program loop PGM_LOOP3, a voltage level of a bit line VBL_B coupled to each of the memory cells MC_B may be set to the program inhibition voltage level VINH.

All memory cells MC_F are programmed to the sixth program state P6 in the (N-1)th program loop PGM_LOOPN-1. Accordingly, a program operation on the memory cells MC_F may be inhibited from the Nth program loop PGM_LOOPN. Accordingly, from the Nth program loop PGM_LOOPN, a voltage level of a bit line VBL_F coupled to each of the memory cells MC_F may be set to the program inhibition voltage level VINH. When all memory cells MC_G are programmed to the seventh program state P7 in the Nth program loop PGM_LOOPN, all memory cells MC_A to MC_F may be regarded as properly programmed and thus the program operation may then end.

Figure 7:
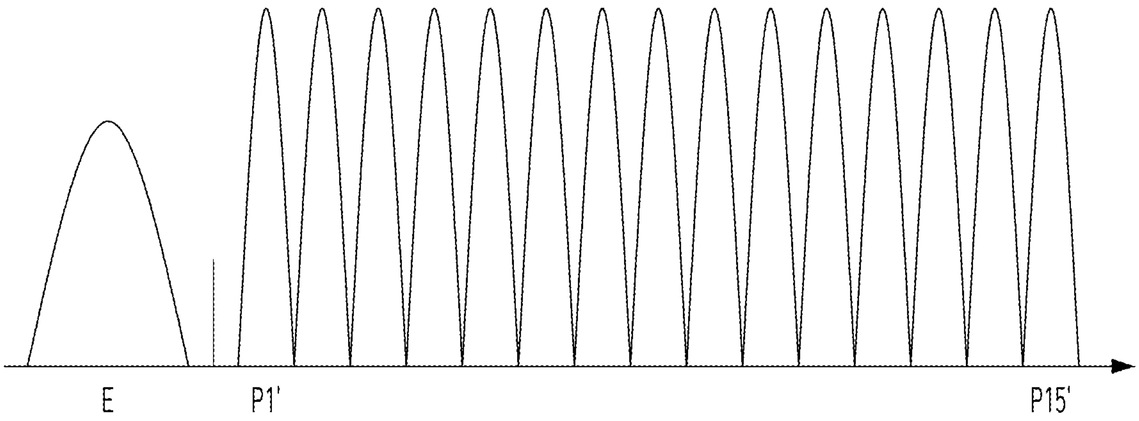
FIGS. 7 and 8 are diagrams illustrating a two-step program operation as an example of a multi-step program operation, according to an embodiment of the present disclosure.
Figure 8:
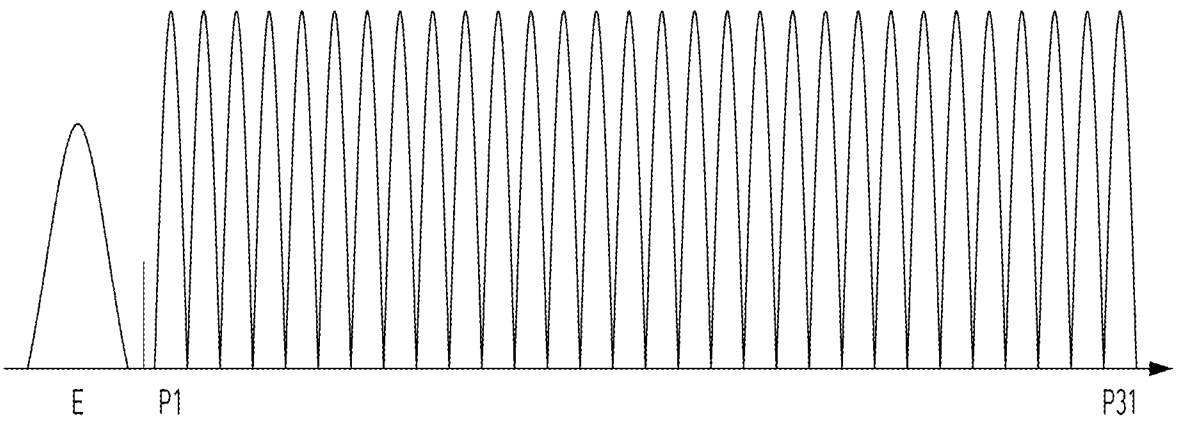

FIGS. 7 and 8 are diagrams illustrating a two-step program operation as an example of a multi-step program operation, according to an embodiment of the present disclosure.

As an example, FIGS. 7 and 8 illustrate a two-step program operation on a page of penta-level cells (PLCs), each of which may fall in one of 32 states including erase state E and $1^{st}$ to $32^{nd}$ program states P1 to P31. The two-step program operation may comprise $1^{st}$ step and $2^{nd}$ step program operations. FIGS. 7 and 8 illustrate results of the $1^{st}$ step and $2^{nd}$ step program operations, respectively.

During the $1^{st}$ step program operation on the PLC page, the storage device 130 may inhibit programming of the PLCs for target threshold voltages of higher levels while applying program pulses to the PLCs for target threshold voltages of lower levels. Upon completion of the $1^{st}$ step program operation on the PLC page, the PLCs may fall in one of 16 states including erase state E and $1^{st}$ to $15^{th}$ program states P1' to P15' as illustrated in FIG. 7. Then, upon completion of the $2^{nd}$ step program operation on the PLC page, the PLCs may fall in one of 32 states including erase state E and $1^{st}$ to $32^{nd}$ program states P1 to P31 as illustrated in FIG. 8.

Quick charge loss (QCL) is a phenomenon associated with a memory cell. Injected charges can either redistribute or escape back in a short time so that the memory cell will exhibit a drop of the threshold voltage thereof in a short time, typically 10 ms time scale. This QCL issue becomes a greater concern as a 3D NAND device keeps scaling and especially when tight threshold voltage distributions are required for, for example, a quadruple-level cell (QLC), a PLC or a greater-bit-per-cell.

A possible solution for the QCL phenomenon is to perform an extra program operation. This extra program operation will push a memory cell with the QCL phenomenon, which drops the threshold voltage thereof, back to the main verify voltage level Vmain or higher. However, apparently this extra program operation is at the cost of program time. The extra program operation also significantly increases the program disturb. Using the two-step program operation on the PLC as an example, in order to compensate for the QCL phenomenon, there is an extra program operation for 32 states besides the $1^{st}$ step and $2^{nd}$ program operations.

According to an embodiment of the present disclosure, however, the extra program operation will not be required and therefore the program time may be significantly improved.

In the present disclosure, an example of the two-step program operation on a PLC page is illustrated. This example should not limit the scope of the present disclosure. For example, when an N-step program operation (N is 3 or greater) as the multi-step program operation is applied to the present disclosure instead of the two-step program operation, the $(N-1)^{th}$ step and $N^{th}$ step program operations (i.e., program operations of the last two steps) may correspond to the $1^{st}$ step and $2^{nd}$ step program operations, respectively.

According to an embodiment, the storage device 130 may perform a detection operation and a compensation operation. The storage device 130 may perform the detection operation between the $1^{st}$ step and $2^{nd}$ step program operations on the PLC page. After completion of the $1^{st}$ step program operation on the PLC page, the storage device 130 may perform the detection operation before the $2^{nd}$ step program operation on the PLC page. The storage device 130 may perform the compensation operation during the $2^{nd}$ step program operation on the PLC page.

According to an embodiment, the storage device 130 may perform the $2^{nd}$ step program operation on the PLC page according to the DPGM scheme described above with reference to FIGS. 4 to 6.

Upon completion of the $1^{st}$ step program operation on the PLC page, all PLCs of the page may fall into actual 16 states corresponding to erase state E and $1^{st}$ to $15^{th}$ program states P1' to P15' as illustrated in FIG. 7. However, in the real world, there may be PLCs with the QCL phenomenon and therefore having respective and actual threshold voltages lower than the main verify voltage level Vmain corresponding thereto, especially the PLCs of higher program states (e.g., the highest program state P15') among the actual 16 states. In the present disclosure, as a result of the $1^{st}$ step program operation of the two-step program operation on a PLC page, the memory cell having the lower threshold voltage than the main verify voltage level Vmain corresponding thereto is defined as a QCL cell and a remaining memory cell other than the QCL cell is defined as a non-QCL cell.

Then, during the detection operation after the $1^{st}$ step program operation on the PLC page, the storage device 130 may detect a QCL cell by reading the PLC page according to the main verify voltage level Vmain corresponding thereto, especially according to the main verify voltage levels Vmain corresponding to higher program states among the 16 states.

Upon completion of the detection operation, the storage device 130 may perform the $2^{nd}$ step program operation on the PLC page according to the DPGM scheme. When the QCL cell becomes the DPGM cell during the $2^{nd}$ step program operation, i.e., when the QCL cell becomes to have a threshold voltage higher than the pre-verify voltage level Vpre (e.g., the QCL cell is determined as “No” at the operation S507 and as “Yes” at the operation S509), the storage device 130 may perform the compensation operation of applying a compensation voltage to a bit line coupled to the QCL cell at the operation S511 in order to compensate for the drop of the threshold voltage of the QCL cell. In an embodiment, the compensation voltage to be applied to the bit line connected to the QCL cell at the operation S511 may have a lower level than a normal voltage to be applied to a bit line connected to a non-QCL cell at the operation S511. In an embodiment, the compensation voltage may have a negative level. As a result of the compensation operation, the threshold voltage of the QCL cell may become compensated or may become higher by a greater amount than the non-QCL cell through the operations S517 and S503 after the operation S511.

Figure 9:
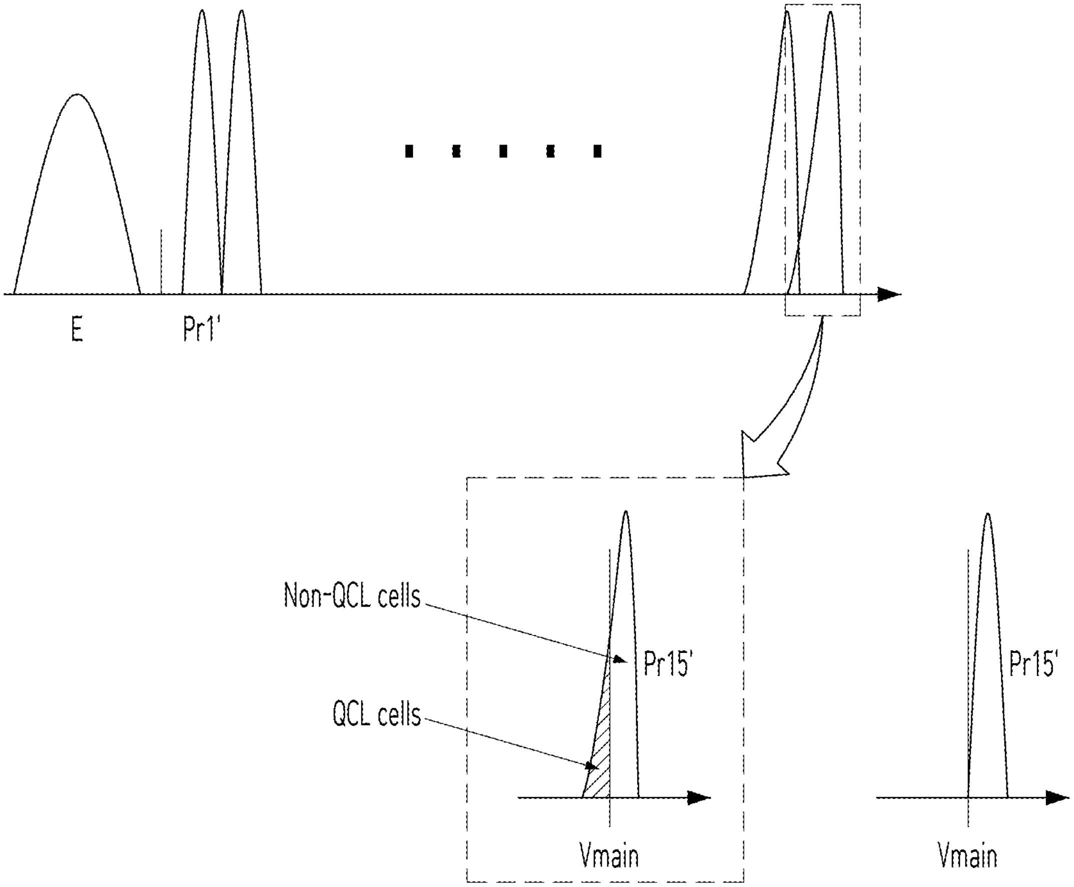
FIG. 9 is a schematic diagram illustrating a detection operation according to an embodiment of the present disclosure.

FIG. 9 is a schematic diagram illustrating the detection operation according to an embodiment of the present disclosure. FIG. 9 shows the actual threshold voltage distributions of PLCs as a result of the detection operation after the $1^{st}$ step program operation on a PLC page.

Referring to FIG. 9, the storage device 130 may perform the detection operation of reading the PLC page according to respective main verify voltage levels Vmain corresponding to higher program states (e.g., the highest program state Pr15') among the “actual” 16 states including the erase state E and program states Pr1' to Pr15' when compared with the “ideal” 16 states E and P1' to P15' illustrated in FIG. 7. Here, the main verify voltage level Vmain utilized for the detection operation is an example of a reference voltage level for detecting the QLC cell and should not limit the scope of the present disclosure.

Among the PLCs of the page during the detection operation, detected may be QLC cells having lower threshold voltages than the main verify voltage level Vmain corresponding thereto. FIG. 9 especially illustrates the actual threshold voltage distribution corresponding to the highest program state Pr15'. With reference to the reference voltage level or the main verify voltage level Vmain for the threshold voltage distribution corresponding to the highest program state Pr15', detected may be QLC cells having lower threshold voltages than the main verify voltage level Vmain. The non-QLC cells may have threshold voltages equal to or higher than the main verify voltage level Vmain for the threshold voltage distribution corresponding to the highest program state Pr15'.

Figures 10, 11:
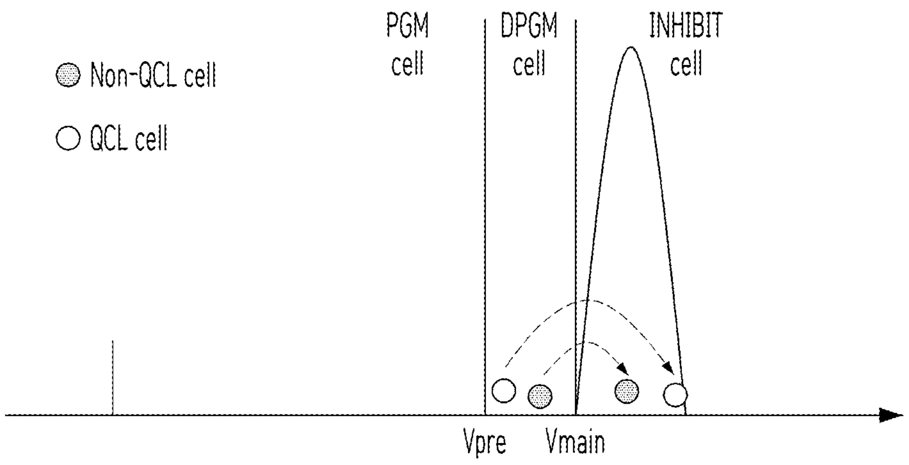
FIG. 10 is a schematic diagram illustrating a compensation operation according to an embodiment of the present disclosure.
FIG. 11 is a table illustrating a voltage to be applied to a bit line coupled to a QLC cell for compensation of the QLC cell, according to an embodiment of the present disclosure.

FIG. 10 is a schematic diagram illustrating the compensation operation according to an embodiment of the present disclosure.

The storage device 130 may perform the $2^{nd}$ step program operation on the PLC page after the detection operation on the PLC page. The storage device 130 may perform the $2^{nd}$ step program operation on the PLC page according to the DPGM scheme described with reference to FIGS. 4 to 6.

Among the PLCs of the page, the storage device 130 may perform the $2^{nd}$ step program operation on the non-QLC cells in the same way of setting the level of the voltage VBL to be applied to the bit lines coupled to the non-QLC cells as described with reference to FIGS. 4 to 6.

However, the storage device 130 may perform the $2^{nd}$ step program operation on the QLC cells in a different way from the non-QLC cells, especially in the operation S511.

When the QCL cell becomes the DPGM cell during the $2^{nd}$ step program operation, i.e., when the QCL cell becomes to have a threshold voltage higher than the pre-verify voltage level Vpre (e.g., the QCL cell is determined as "No" at the operation S507 and as "Yes" at the operation S509 during the $2^{nd}$ step program operation according to the DPGM scheme as illustrated in FIG. 4), the storage device 130 may perform the compensation operation of applying a compensation voltage to a bit line coupled to the QCL cell at the operation S511 in order to compensate for the drop (see FIG. 9) of the threshold voltage of the QCL cell. In an embodiment, the compensation voltage to be applied to the bit line coupled to the QCL cell at the operation S511 may have a lower level than the level of the voltage VBL to be applied to a bit line coupled to a non-QCL cell at the operation S511. In an embodiment, the compensation voltage may have a negative level. As a result of the compensation operation, the threshold voltage of the QCL cell may become compensated, i.e., may become higher by a greater amount than the non-QCL cell, as illustrated in FIG. 10, through the operations S517 and S503 after the operation S511.

FIG. 11 is a table illustrating a voltage to be applied to a bit line coupled to a QLC cell for the compensation of the QLC cell, according to an embodiment of the present disclosure.

As described above, the storage device 130 may detect the QCL cell during the detection operation after the $1^{st}$ step program operation on the PLC page, and also may detect the QCL cell as the DPGM cell during the $2^{nd}$ step program operation on the PLC page. Also, as described above, the storage device 130 may apply, to the bit line of the QCL cell as the DPGM cell, the compensation voltage of a lower level than the level of the voltage VBL to be applied to a bit line coupled to a non-QCL cell at the operation S511.

For the detection of the QCL cell as the DPGM cell, the storage device 130 may include a data latch configured to latch data bits representing a result of logical operation on $1^{st}$ and $2^{nd}$ data bits. The $1^{st}$ data bit may represent whether or not a memory cell of the PLC page is a QCL cell, the PLC page being the target of the detection operation. The $2^{nd}$ data bit may represent whether or not the QCL cell is the DPGM cell or not. The logical operation on the $1^{st}$ and $2^{nd}$ data bits may reveal the memory cell of the PLC page as the QCL cell and also as the DPGM cell.

As an example, FIG. 11 illustrates "QCL" as the value of the $1^{st}$ data bit and "PVpre" as the value of the $2^{nd}$ data bit. Also, as an example, FIG. 11 illustrates, as the logical operation, a logical AND operation on the complementary bit of the $1^{st}$ data bit and the $2^{nd}$ data bit.

For example, referring to FIG. 11, the $1^{st}$ data bit may have a value of zero (0) when the memory cell of the PLC page is a QCL cell, and may have a value of one (1) when the memory cell of the PLC page is a non-QCL cell. For example, the $2^{nd}$ data bit may have a value of zero (0) when the QCL cell is a non-DPGM cell and may have a value of one (1) when the QCL cell is a DPGM cell. When the memory cell of the PLC page is a QCL cell and also a DPGM cell, the storage device 130 may latch a value of one (1) in the data latch according to a result of the logical AND operation on the complementary bit of the $1^{st}$ data bit and the $2^{nd}$ data bit. Accordingly, the storage device 130 may apply, according to the latched value of one (1), the compensation voltage to the bit line of the QCL cell as the DPGM cell.

Figure 12:
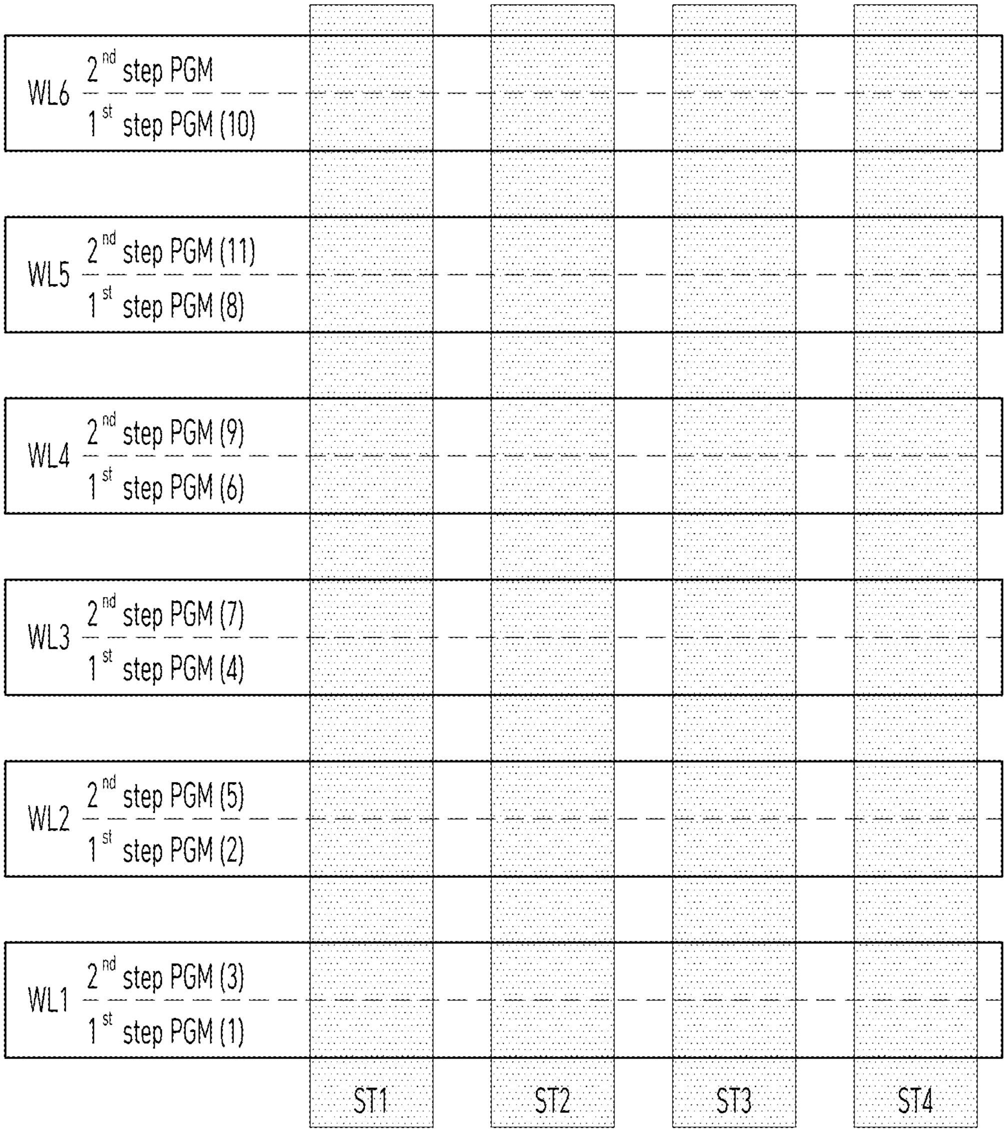
FIG. 12 is a schematic diagram illustrating a two-step program operation on a memory cell array according to an embodiment of the present disclosure.

FIG. 12 is a schematic diagram illustrating the two-step program operation on the memory cell array 210 according to an embodiment of the present disclosure.

FIG. 12 illustrates a view of the memory cell array 210 as a PLC array including $1^{st}$ to $6^{th}$ word lines WL1 to WL6 and $1^{st}$ to $4^{th}$ strings ST1 to ST4. Although not illustrated, PLCs may be coupled to intersections between the $1^{st}$ to $6^{th}$ word lines WL1 to WL6 and the $1^{st}$ to $4^{th}$ strings ST1 to ST4. For example, $1^{st}$ to $4^{th}$ PLCs PLC11 to PLC14 respectively belonging to the $1^{st}$ to $4^{th}$ strings ST1 to ST4 may be coupled to the $1^{st}$ word line WL1. For example, $1^{st}$ to $4^{th}$ PLCs PLC21 to PLC24 respectively belonging to the $1^{st}$ to $4^{th}$ strings ST1 to ST4 may be coupled to the $2^{nd}$ word line WL2. For example, $1^{st}$ to $4^{th}$ PLCs PLC31 to PLC34 respectively belonging to the $1^{st}$ to $4^{th}$ strings ST1 to ST4 may be coupled to the $3^{rd}$ word line WL3. Each of the respective groups of the $1^{st}$ to $4^{th}$ PLCs PLC11 to PLC14, the $1^{st}$ to $4^{th}$ PLCs PLC21 to PLC24 and the $1^{st}$ to $4^{th}$ PLCs PLC31 to PLC34 may configure a PLC page as the target of the two-step program operation.

FIG. 12 illustrates the $1^{st}$ step and $2^{nd}$ step program operations to be performed on each of the PLC pages coupled to the respective $1^{st}$ to $6^{th}$ word lines WL1 to WL6. In FIG. 12, the numbers in parenthesis marked with the $1^{st}$ step and $2^{nd}$ step program operations ("$1^{st}$ step PGM" and "$2^{nd}$ step PGM") on each of the $1^{st}$ to $6^{th}$ word lines WL1 to WL6 refer to the sequence or order of the $1^{st}$ step and $2^{nd}$ step program operations. That is, the storage device 130 may sequentially perform the $1^{st}$ step program operation ("$1^{st}$ step PGM (1)") on the PLC page coupled to the $1^{st}$ word line WL1, then the $1^{st}$ step program operation ("$1^{st}$ step PGM (2)") on the PLC page coupled to the $2^{nd}$ word line WL2, then the $2^{nd}$ step program operation ("$2^{nd}$ step PGM (3)") on the PLC page coupled to the $1^{st}$ word line WL1, then the $1^{st}$ step program operation ("$1^{st}$ step PGM (4)") on the PLC page coupled to the $3^{rd}$ word line WL3, then the $2^{nd}$ step program operation ("$2^{nd}$ step PGM (5)") on the PLC page coupled to the $2^{nd}$ word line WL2, and so forth.

Figure 13:
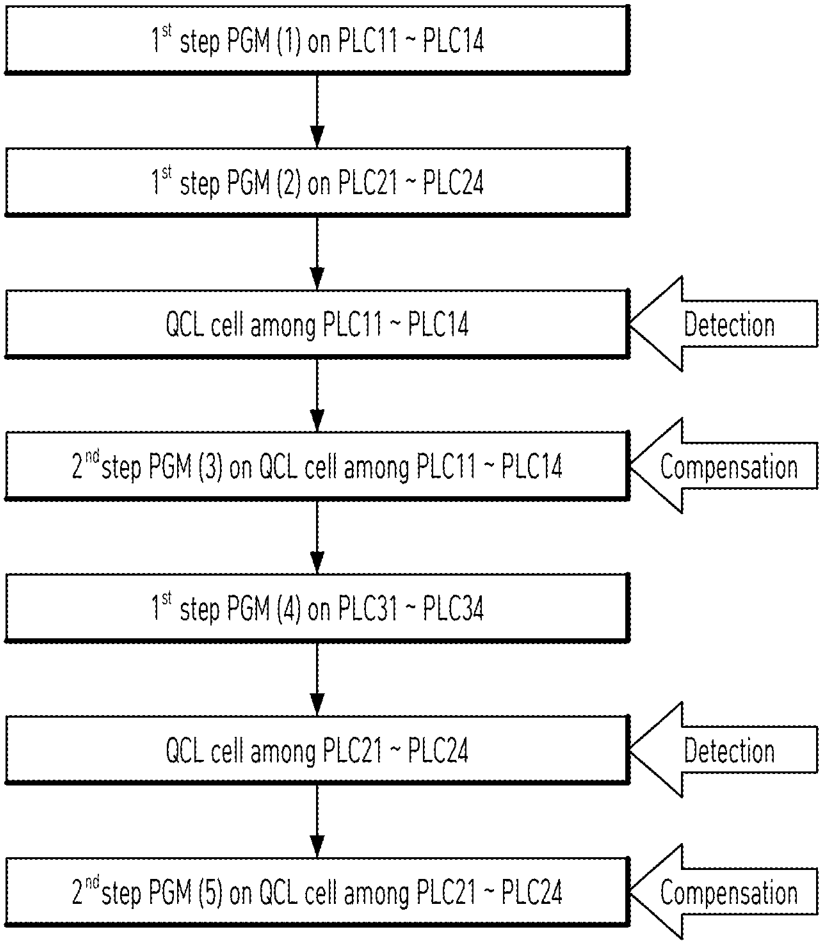
FIG. 13 is a flowchart illustrating operations of detecting and compensating a QLC cell during a two-step program operation, according to an embodiment of the present disclosure.

FIG. 13 is a flowchart illustrating operations of detecting and compensating a QLC cell during the two-step program operation, which is to be performed on the PLC array illustrated in FIG. 12, according to an embodiment of the present disclosure.

Referring to FIGS. 12 and 13, upon completion of the sequence of the $1^{st}$ step program operation on the PLC page (i.e., the group of the $1^{st}$ to $4^{th}$ PLCs PLC11 to PLC14, where PLC14 for example, means pages on string 4, WL1) coupled to the $1^{st}$ word line WL1 and the $1^{st}$ step program operation on the PLC page (i.e., the group of the $1^{st}$ to $4^{th}$ PLCs PLC21 to PLC24) coupled to the $2^{nd}$ word line WL2, the storage device 130 may perform the detection operation to detect a QCL cell within the PLC page of the $1^{st}$ to $4^{th}$ PLCs PLC11 to PLC14. Upon the completion of the detection operation, the storage device 130 may perform the compensation operation through the $2^{nd}$ step program operation on the detected QCL cell within the PLC page of the $1^{st}$ to $4^{th}$ PLCs PLC11 to PLC14. Then, upon completion of the sequence of the $1^{st}$ step program operation on the PLC page (i.e., the group of the $1^{st}$ to $4^{th}$ PLCs PLC31 to PLC34) coupled to the $3^{rd}$ word line WL3, the storage device 130 may perform the detection operation to detect a QCL cell within the PLC page of the $1^{st}$ to $4^{th}$ PLCs PLC21 to PLC24. Upon the completion of the detection operation, the storage device 130 may perform the compensation operation through the $2^{nd}$ step program operation on the detected QCL cell within the PLC page of the $1^{st}$ to $4^{th}$ PLCs PLC21 to PLC24.

Although the foregoing embodiments have been illustrated and described in some detail for purposes of clarity and understanding, the present invention is not limited to the embodiments provided. There are many alternative ways of implementing the invention, as one skilled in the art will appreciate in light of the foregoing disclosure. The disclosed embodiments are thus illustrative, not restrictive. The present invention is intended to embrace all modifications and alternatives of the disclosed embodiments. Furthermore, the disclosed embodiments may be combined to form additional embodiments.

Indeed, implementations of the subject matter and the functional operations described in the present disclosure can be implemented in various systems, digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter affecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and one or more processors of any type of digital computer. Generally, a processor will receive instructions and data from a read only memory or a random-access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While present disclosure contains many specifics, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations, one or more features from a combination can in some cases be excised from the combination, and the combination may be directed to a sub-combination or a variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in the present disclosure should not be understood as requiring such separation in all embodiments.

Only a few embodiments and examples are described and other embodiments, enhancements and variations can be made based on what is described and illustrated in the present disclosure. Furthermore, the embodiments may be combined to form additional embodiments.

What is claimed is:

1. An operating method of a storage device, the method comprising:

performing an $(N-1)^{th}$ step program operation of N number of step program operations on a group of non-volatile memory cells, N being a natural number of 2 or greater;

performing, after completion of the $(N-1)^{th}$ step program operation, a detection operation of detecting quick charge loss in a quick charge loss (QCL) cell belonging to the group, where the QCL cell exhibits a drop of threshold voltage as injected charges are loss from the QCL cell; and performing, upon completion of the detection operation, an $N^{th}$ step program operation of the N number of step program operations, the $N^{th}$ step program operation including a compensation operation of compensating the threshold voltage of the QCL cell to become greater than a voltage threshold of a non-QCL cell, wherein the $N^{th}$ step program operation is performed according to a double verify program (DPGM) scheme.

2. The operating method of claim 1, wherein the non-volatile memory cells are quadruple-level cells (QLCs) or higher-level cells.

3. The operating method of claim 1, wherein the QCL cell has, as a result of the $(N-1)^{th}$ step program operation, a lower threshold voltage than a predetermined voltage level equal to a threshold voltage corresponding to a program state.

4. The operating method of claim 1, wherein the $N^{th}$ step program operation includes plural program loops each comprising a program pulse application process and a verification process, wherein the program pulse application process includes applying a program pulse to the QCL cell, the program pulse becoming higher as the plural program loops proceed, and wherein the verification process includes a first process using a pre-verify voltage level and a second process using a main verify voltage level.

5. The operating method of claim 4, wherein the verification process includes detecting the threshold voltage of the QCL cell between the pre-verify voltage level and the main verify voltage level.

6. The operating method of claim 5, wherein the compensation operation includes applying a compensation voltage to a bit line coupled to the QCL cell for a subsequent one of the plural program loops, and wherein the compensation voltage has a lower level than a level of a voltage to be applied to a bit line coupled to the non-QCL cell.

7. The operating method of claim 6, wherein the compensation voltage has a negative level.

8. A storage device comprising:

a group of non-volatile memory cells; and a control circuit configured to perform an $(N-1)^{th}$ step program operation of N number of step program operations on the group, N being a natural number of 2 or greater, perform, after completion of the $(N-1)^{th}$ step program operation, a detection operation of detecting quick charge loss in a quick charge loss (QCL) cell belonging to the group where the QCL cell exhibits a drop of threshold voltage as injected charges are loss from the QCL cell, and perform, upon completion of the detection operation, an $N^{th}$ step program operation of the N number of step program operations, the $N^{th}$ step program operation including a compensation operation of compensating the threshold voltage of the QCL cell to become greater than a voltage threshold of a non-QCL cell, wherein the control circuit performs the $N^{th}$ step program operation according to a double verify program (DPGM) scheme.

9. The storage device of claim 8, wherein the non-volatile memory cells are quadruple-level cells (QLCs) or higher-level cells.

10. The storage device of claim 8, wherein the QCL cell has, as a result of the $(N-1)^{th}$ step program operation, a lower threshold voltage than a predetermined voltage level equal to a threshold voltage corresponding to a program state.

11. The storage device of claim 8, wherein the control circuit performs the $N^{th}$ step program operation through plural program loops each comprising a program pulse application process and a verification process, wherein the control circuit performs the program pulse application process by applying a program pulse to the QCL cell, the program pulse becoming higher as the plural program loops proceed, and wherein the control circuit performs the verification process including a first process using a pre-verify voltage level and a second process using a main verify voltage level.

12. The storage device of claim 11, wherein the control circuit performs the verification process by detecting the threshold voltage of the QCL cell between the pre-verify voltage level and the main verify voltage level.

13. The storage device of claim 12, wherein the control circuit performs the compensation operation by applying a compensation voltage to a bit line coupled to the QCL cell for a subsequent one of the plural program loops, and wherein the compensation voltage has a lower level than a level of a voltage to be applied to a bit line coupled to the non-QCL cell.

14. The storage device of claim 13, wherein the compensation voltage has a negative level.

* * * * *